(12) United States Patent
Tsai

(10) Patent No.: US 8,054,876 B2
(45) Date of Patent: Nov. 8, 2011

(54) ACTIVE DELAY LINE

(75) Inventor: Huan-Shang Tsai, Cupertino, CA (US)

(73) Assignee: Infinera Corporation, Sunnyvale, CA (US)

( * ) Notice: Subject to any disclaimer, the term of this patent is extended or adjusted under 35 U.S.C. 154(b) by 780 days.

(21) Appl. No.: 11/329,265

(22) Filed: Jan. 10, 2006

(65) Prior Publication Data
US 2007/0133671 A1   Jun. 14, 2007

Related U.S. Application Data

(60) Provisional application No. 60/750,003, filed on Dec. 13, 2005.

(51) Int. Cl.
*H03H 7/30* (2006.01)
(52) U.S. Cl. .......... 375/233; 375/232; 333/18; 333/28 R
(58) Field of Classification Search .................. 375/232, 375/233, 229, 230, 350; 333/18, 28 R, 165, 333/166, 167; 708/819
See application file for complete search history.

(56) References Cited

U.S. PATENT DOCUMENTS

| | | | |
|---|---|---|---|
| 3,922,596 A | 11/1975 | Cave et al. | |
| 4,743,859 A | 5/1988 | Sosin | |
| 5,003,269 A | 3/1991 | Lehnann | |
| 5,119,365 A | 6/1992 | Warner et al. | |
| 5,144,174 A | 9/1992 | Murakami | |
| 5,177,451 A | 1/1993 | Lehnann | |
| 5,777,529 A | 7/1998 | Lowe | |
| 6,351,191 B1 * | 2/2002 | Nair et al. | 331/57 |
| 6,545,567 B1 * | 4/2003 | Pavan et al. | 333/166 |
| 6,552,708 B1 | 4/2003 | Wang et al. | |
| 6,617,905 B1 | 9/2003 | An et al. | |
| 7,158,567 B2 * | 1/2007 | Wang et al. | 375/232 |
| 7,283,586 B2 * | 10/2007 | Upton | 375/232 |
| 7,301,997 B1 * | 11/2007 | Wang et al. | 375/232 |
| 7,505,515 B1 * | 3/2009 | Choudhary et al. | 375/233 |
| 2001/0007479 A1 * | 7/2001 | Kim | 348/614 |
| 2004/0012433 A1 * | 1/2004 | Kim et al. | 327/350 |
| 2004/0202027 A1 | 10/2004 | Kuzmenka et al. | |
| 2004/0227554 A1 | 11/2004 | Park | |
| 2005/0008070 A1 * | 1/2005 | Wang et al. | 375/232 |
| 2005/0030884 A1 * | 2/2005 | Kim et al. | 370/201 |

(Continued)

FOREIGN PATENT DOCUMENTS

EP     209987 B1     12/1991

(Continued)

OTHER PUBLICATIONS

H.M. Rein and M.Moller, "Design Considerations for Very-High-speed Si-Bipolar IC's Operating up to 50 Gb/s", Aug. 1996, IEEE.*

(Continued)

*Primary Examiner* — Chieh M Fan
*Assistant Examiner* — Aristocratis Fotakis
(74) *Attorney, Agent, or Firm* — W. Douglas Carothers; David L. Soltz

(57) ABSTRACT

A delay line for deployment in an equalizer to insert a delay in a signal received by the delay line employs a plurality of cascaded delay stages where the delay per stage provided by an active unit-gain amplifier in each stage that provides sufficient impedance mismatch between the delay stages without substantial deterioration of the frequency response of the client signal undergoing deterioration of the frequency response of the client signal undergoing delay.

8 Claims, 11 Drawing Sheets

U.S. PATENT DOCUMENTS

| | | | |
|---|---|---|---|
| 2005/0114426 A1* | 5/2005 | Lin et al. ................... | 708/800 |
| 2005/0114428 A1* | 5/2005 | Mukherjee et al. ........... | 708/819 |
| 2005/0135475 A1* | 6/2005 | Momtaz et al. ............ | 375/240 |
| 2005/0220185 A1* | 10/2005 | Dowling ................... | 375/232 |
| 2006/0097777 A1* | 5/2006 | Reynolds .................. | 327/551 |
| 2006/0170471 A1* | 8/2006 | Haerle et al. ............... | 327/158 |
| 2006/0188043 A1* | 8/2006 | Zerbe et al. ................ | 375/346 |
| 2006/0239390 A1* | 10/2006 | Kim et al. .................. | 375/350 |
| 2006/0251199 A1* | 11/2006 | Machesney ................ | 375/350 |

FOREIGN PATENT DOCUMENTS

| | | |
|---|---|---|
| EP | 1445879 A1 | 8/2004 |
| WO | WO 2004/062158 A2 | 7/2004 |

OTHER PUBLICATIONS

Vasanth Kakani and Foster F.Dai, Integrated Electronic Equalizer for Dispersion Compensation in 10Gb/s Fiber Networks, Auburn University, Sep. 8-10, 2004.*

James Buckwalter and Ali Hajimiri, "An Active Analog Delay and the Delay Reference Loop", California Institute of Technology, Pasadena, CA 91125, 2004 IEEE.*

Wu et al., "Integrated Transversal Equalizers in High-Speed Fiber-Optic Systems", IEEE Journal of Solid-State Circuits, vol. 38(12), pp. 2131-2137, Dec. 2003.

Lee et al., "MMIC Adaptive Transversal Filtering Using . . . Suitable for High-Speed Lightwave Systems", IEEE Photonics Technology Letters, vol. 12(2), pp. 196-198, Feb. 2000.

McPherson et al., "A 10 Gb/s Adaptive Equalizer . . . Optical Transmission Systems", 3 Pages, 2005 OFC Conference Proceedings, Electrical Processing, Mar. 6-11, 2005.

Hazneci et al., "A 49-Gb/s, 7-Tap . . . Backplane Equalization", IEEE Compound Semiconductor Integrated Circuits Symposium, Monterey, CA, Technical Digest, pp. 101-104, Oct. 2004.

Pelard et al., "Realization of Multigogbit Chanel . . . Cancellation Integrated Circuits", IEEE Journal of Solid-State Circuits, vol. 39(10), pp. 1659-1670, Oct. 2004.

* cited by examiner

Input Signal to FFE 50

Electrical Output of FFE 50 with Active Cells 52 in Non-Operation

Electrical Output with FFE 50 Operational

ACTIVE DELAY LINE

BACKGROUND OF THE INVENTION

1. Field of the Invention

This invention relates generally to equalizers employed in data and clock recovery in telecommunication systems, more particularly to delay line implementations employed in a feed-forward equalizer (FFE) or a decision feedback equalizer (DFE), and most particularly to an active delay line employed in such equalizers.

2. Description of the Related Art

The demand for bandwidth in optical telecommunication networks has pushed operating network transmission rates for long-haul backbone to 10 Gb/s, which is more susceptible to chromatic dispersion and polarization mode dispersion. This will become more of a problem with the advent of backbones operating at transmission rates of 40 Gb/s. Optical domain dispersion compensation modules (DCMs) have been traditionally employed to restore the transported signals at the optical receiver to be sufficiently discernable at a CDR circuit and make highly competent decisions as to binary 1's and 0's in the signal data stream. The primary source of signal dispersion is signal pulse broadening due to fiber dispersion on the transported signal. In general, these DCMs include optical dispersion compensating fiber (DCF) which is capable of providing dispersion compensation for multiple signals received at the receiver as a WDM or DWDM signal. However, in certain cases, such as when only a few signal channels are in operation, such as due to less than all channels in a system concurrently operating for a period of time due to initial stages of network deployment so that the expensive nature of DCMs will raise network costs, particularly at the time of initial network installation.

Instead of deploying optical domain solutions, another traditional approach is the electrical domain solution employing electronic dispersion compensation circuits which are also referred to as adaptive equalizers. They are of particular interest because they potentially offer lower cost and greater flexibility in system design as well as a way to mitigate fiber impairments imposed on the transport WDM/DWDM signal without any required foreknowledge of the optical link or span characteristics and parameters.

As known in the art of equalizers, there are two different types: the feedforward equalizer (FFE) and the decision feedback equalizer (DFE). At network transmission rates at 10 GB/s, FFE is typically implemented as a delay line plus a buffer or a transversal filter since they can compensate for many types of linear distortion. These type of filters may be as long as 8.4 mm on an equalizer chip. Such equalizers have a delay line comprising a series of connected passive delays where taps are provided between the delays and the taped delayed outputs are multiplied by equalization coefficients or weights and are then summed to generate an equalized output. Other delay line architectures have been proposed such as the adaptive distributed circuit type comprising two transmission lines with intermediate gain stages which amplify the output signals from the first transmission line by a gain proportional to a corresponding equalization coefficient or weight. A problem with these types of equalizers is that the delay lines are comparatively large, taking a lot of IC chip real estate.

What is desired is an adaptive equalizer that is more cost effective by being more compact as implemented in MMIC.

SUMMARY OF THE INVENTION

According to this invention, a delay line for deployment in an equalizer to insert a delay in a signal received by the delay line employs a plurality of cascaded delay stages where the delay per stage is provided by at least one active unit-gain amplifier in each stage that provides sufficient impedance mismatch between the delay stages without substantial deterioration of the frequency response of the client signal undergoing equalization.

The delay line may also be utilized in the backplane of telecommunication equipment and optical transport equipment for long-haul, metro or local area networks.

Other objects and attainments together with a fuller understanding of the invention will become apparent and appreciated by referring to the following description and claims taken in conjunction with the accompanying drawings.

BRIEF DESCRIPTION OF THE DRAWINGS

In the drawings wherein like reference symbols refer to like parts.

DETAILED DESCRIPTION OF THE INVENTION

Figure 1:
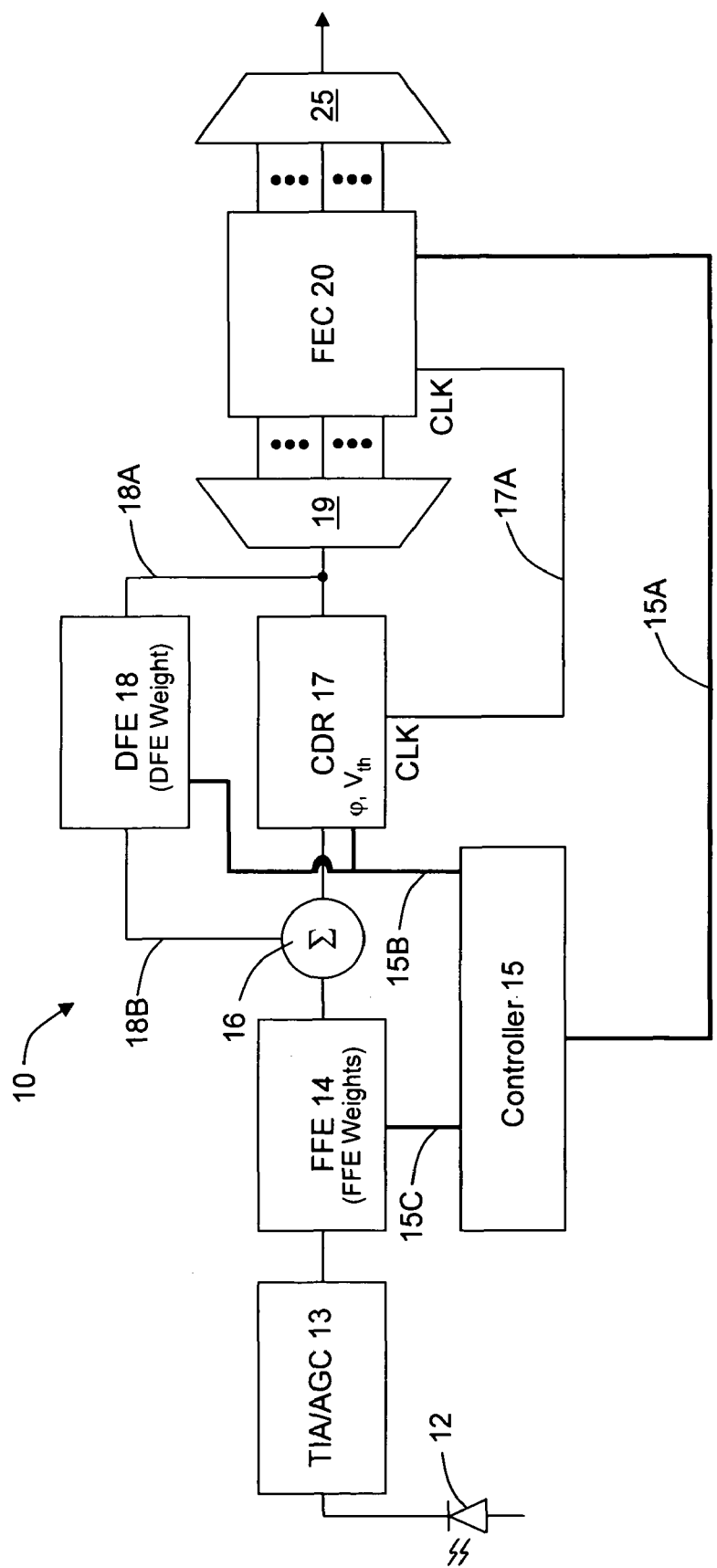
FIG. 1 is a diagrammatic view of an optical receiver to which this invention may be applied.

Reference is now made to FIG. 1 which illustrates a block diagram of a conventional optical receiver 10 that may be utilized in connection with this invention. The receiver 10 has a signal path that includes photodetector 12 where the optical signal is converted into a current signal, the amplitude of which is representative of the optical pulses of the incoming optical channel signal such as in the case of amplitude modulated channel signals. This current signal is then converted into a voltage signal at transimpedance amplifier 13. TIA/AGC 13 also includes an automatic gain control AGC circuit to amplify the signal. The signal is then provided to analog transversal filter (TF) or linear feed forward equalizer (FFE) 14, as known in the art and as illustrated in more detail in FIG. 2. FFE 14, which is a tapped delay line, provides for correction of transmission impairments to the channel signal, particularly group velocity dispersion (GVD) of the transmitted signal. At the input of FFE 14, the electrical signal is delayed, divided into several paths, recombined and amplified and, then, sent onto clock and data recovery (CDR) circuit 17.

Circuit 17 provides for clock and data recovery (CDR) from the data signal and includes a decision circuit (DEC) for determining whether a bit is a binary "1" or a binary "0". The output from FFE 14 is connected, via summer circuit 16, to CDR circuit 17. Circuit 17 also includes an eye-monitor circuit to estimate the vertical eye margin and a phase locked loop (PLL) for timing or phase margins. The recovered signal clock is provided to the FEC circuit 20 via line 17A. At the output of CDR circuit 17, there is a feedback line 18A to a one-bit nonlinear decision feedback equalizer (DFE) 18 which provides for additional signal distortion correction. Such equalizers are particularly included in optical receivers that process data rates at or beyond 10 Gbps. The weighted feedback from DFE 18 is provided on line 18B to summer 16 where it is combined with the incoming signal to provide further signal equalization prior to data recovery at circuit 17.

Controller 15 is an adaptive control that includes a CPU or computer system as well as an error monitor for both FFE 14 and DFE 18 and is coupled to them respectively via lines 15A and 15B as well as coupled to CDR circuit 17. Controller 15 also receives error counts from FEC 20 via line 15A. A function of controller 15 is to provide for weight coefficients to both FFE 14 and DFE 18 based on error counts received from FEC 20.

The distortion compensated signal emerging from CDR circuit 17 is provided to deserializer 19 to separate the recovered serial data signal into plural lower bit rate data signal portions which portions are then FEC decoded at FEC 20 with appropriate corrections being made to errored 1's or errored 0's in the signal. Next, the corrected signal portions are combined at serializer 25 to provide a substantially better distortion-free signal that is a fair replica of the optical signal received at photodetector 12. In some FEC decoder embodiments, the signal need not to be deserialized in this manner but such deserialization enhances the rate of corrective determination to be made to the incoming data signal. The FEC error correcting codes that may be employed, for example R-S codes, BCH codes, Hamming codes, Viterbi codes, turbo codes or concatenated codes.

Figure 2:
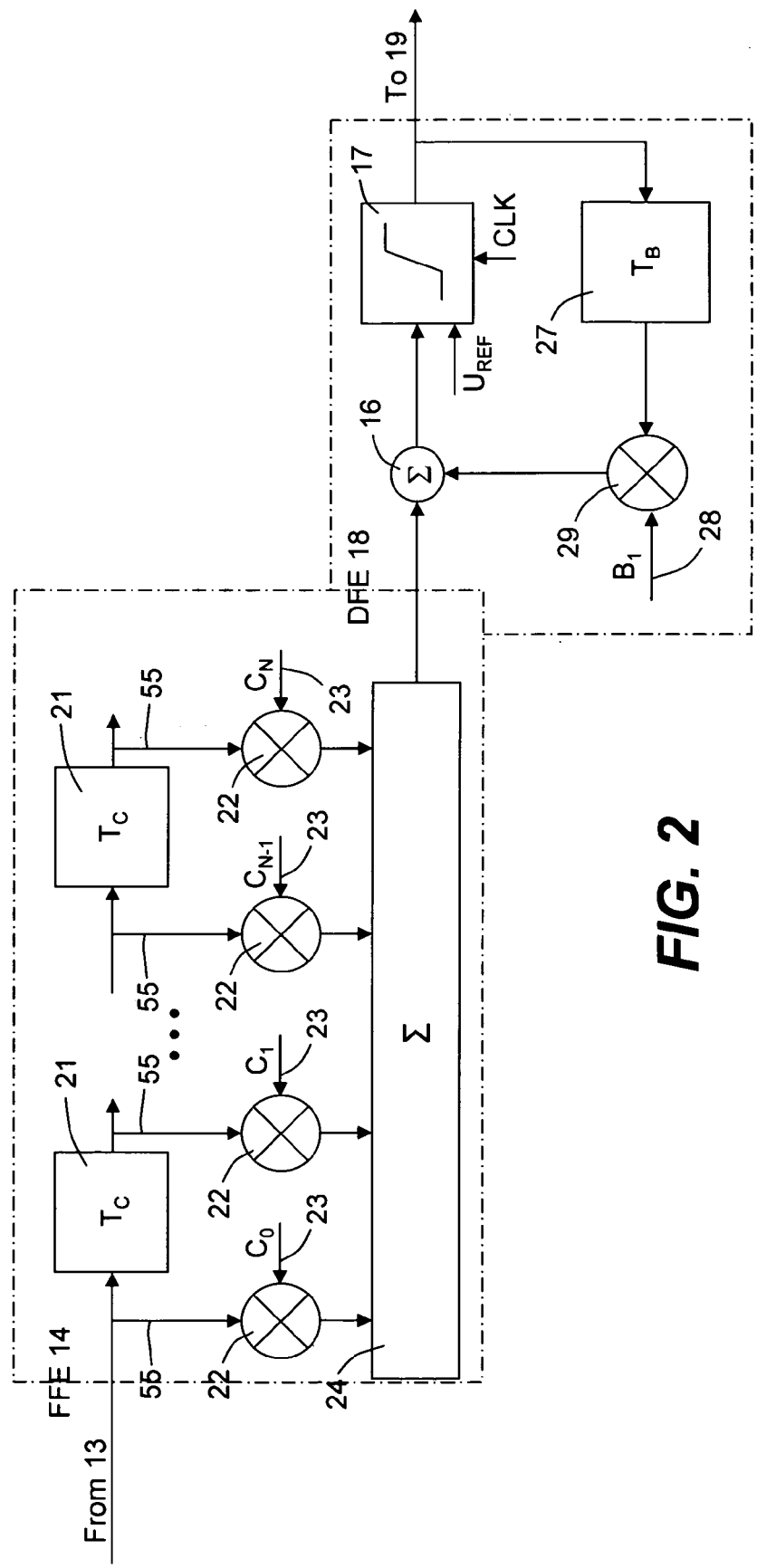
FIG. 2 is a diagrammatic view of equalizer circuits, both feedforward equalizer (FFE) with multiple delays and decision feedback equalizer (DFE) that may be employed in the optical receiver shown in FIG. 1.

Reference is now made to FIG. 2 which illustrates in further detail a conventional FFE 14 and DFE 18 of FIG. 1. These equalizers comprise delay stages in concatenated arrangement. The equalizer circuits can be realized as ICs employing SiGe technology, for example. The data signal is received by FFE 14 and is divided into several paths with intervening time delays 21. The delay from each stage including the input to FFE 14 is provided as with a tap 55 to multiplication stages 22. Each piece of data performs a multiplication at multiplication stages 22 with corresponding weight setting values, $C_0, C_1, \ldots, C_{N-1}$, and $C_N$, which produces a series of filtered values. The resulting values from the multiplication stages 22 are then summed at summer circuit 24. Each stage provides N delays, such as by 50 ps per stage. The superimposed weighted signals are then provided at FFE output to input summer circuit 16 in DFE 18. The tap weights, $C_0, C_1, \ldots, C_{N-1}$, and $C_N$, are adjusted by external tuning voltages which are applied to the multiplication stages 22 thereby enabling the filter 14 to adapt to actual signal distortions.

DFE 18 is a digital filter and takes the last bit from the current signal which has been acted upon relative to bit decision in CDR decision circuit 17 and is delayed at 27, for example, by $T_B$=100 ps, and the weight value $B_1$, presented at 28, is multiplied with the bit value at single stage 29 and added to the current bit value at input summer circuit 16. The basic approach of DFE 18 is to subtract out interferences coming from previous decided data bits so that the decision on the current bit is made based on the current signal bit minus interference on a succeeding or forward looking signal bit. This DFE function is highly useful toward further mitigation of signal chromatic dispersion at higher bit rates, such as 10 Gb/s or higher.

Figure 3:
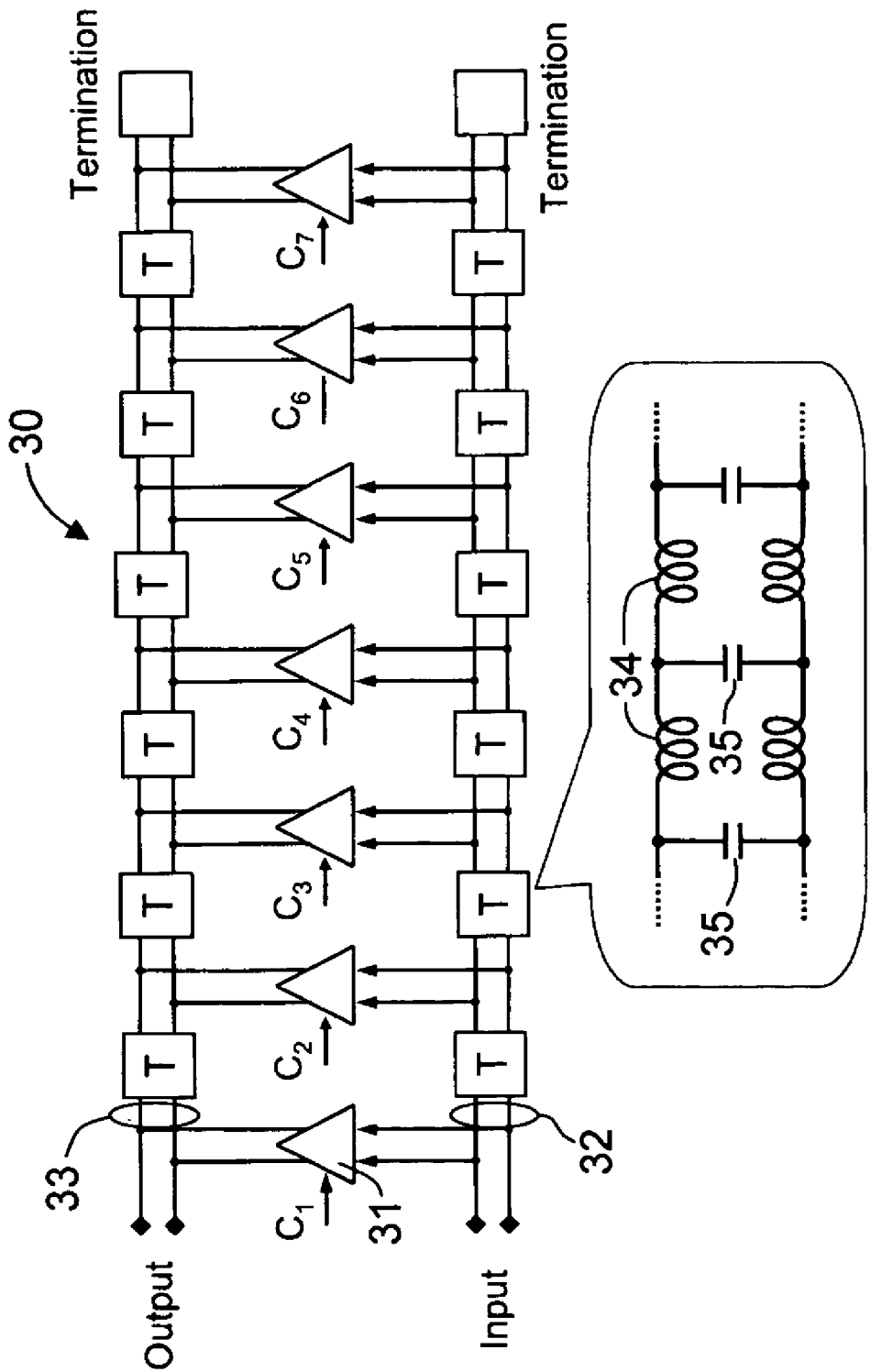
FIG. 3 is another structure of a feedforward equalizer (FFE) which may be used as a FFE in FIG. 2.

Reference is now made to FIG. 3 which shows the details of another conventional electronic dispersion circuit or equalizer 30 that forms a passive delay line with a plurality of taps, here shown as an integrated transversal filter with distributed circuit architecture with intervening weighted gain stages 31 between two transmission lines 32 and 33. At transmission transport rates at 10 Gb/s and higher, the FFE is typically implemented as a transversal filter which is basically a distributed amplifier, commonly employed in microwave circuits. This particular filter has multiple delay stages each with a delay time period, T, and is taken from the paper of Wu et al. entitled, "Integrated Transversal Equalizers in High-Speed Fiber-Optic Systems", *IEEE Journal of Solid-State Circuits*, Vol. 38(12), pp. 2131-2137, December 2003. Another example of a transversal filter is illustrated in the paper of Lee et al. entitled, "MMIC Adaptive Transversal Filtering Using Gilbert Cells and is Suitable for High-Speed Lightwave Systems", *IEEE Photonics Technology Letters*, Vol. 12(2), pp. 196-198, February 2000. Either lumped elements, such as inductors 34 and capacitors 35, and/or distributed elements, such as the deployment of one or more transmission lines 32 and 33, are employed to create the signal delay. A known drawback of employing this approach is that a large IC chip area is necessary for occupancy by the delay elements which also makes it difficult to form such an array in confined IC chip areas.

Figure 4:
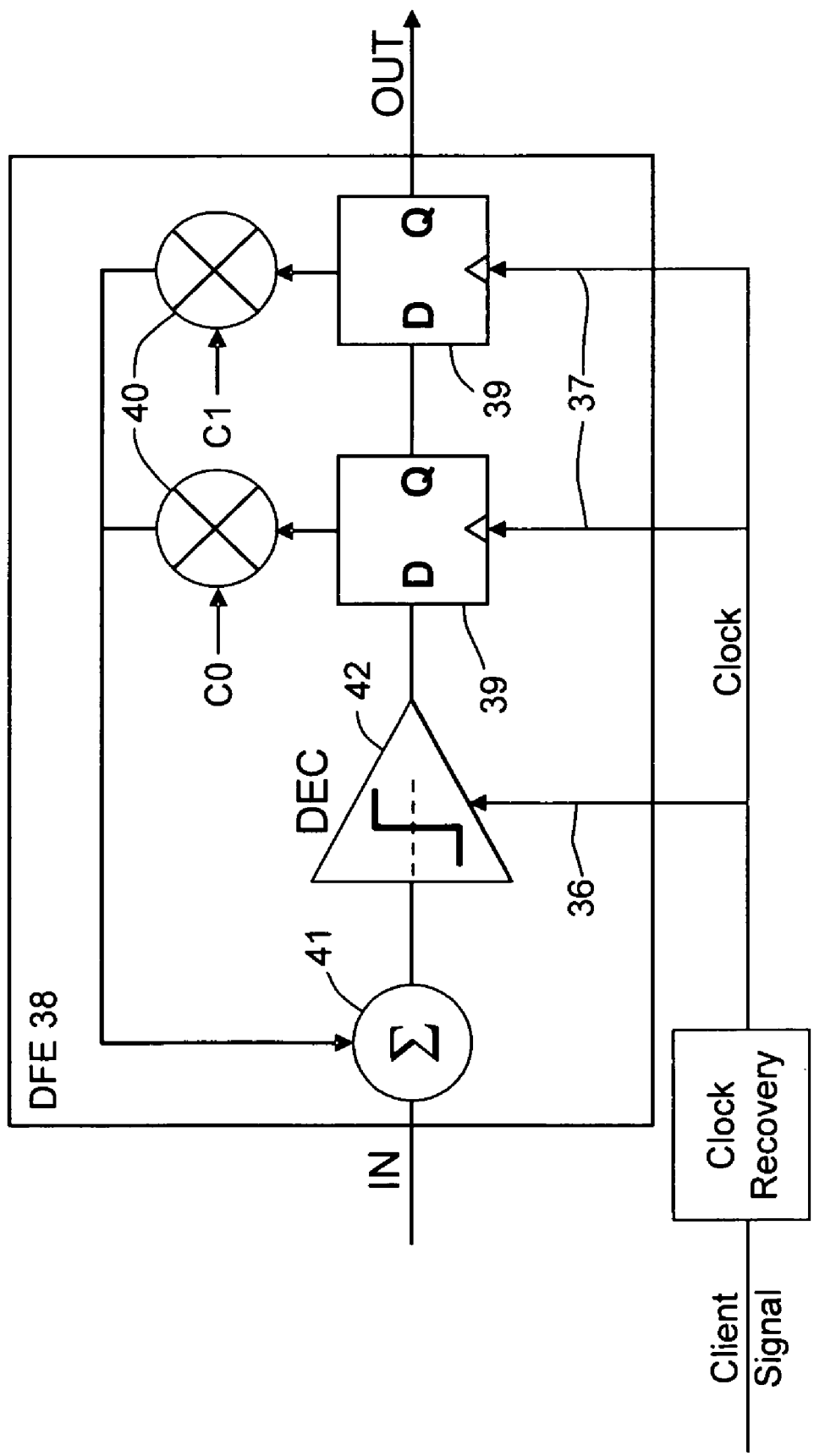
FIG. 4 is another version of decision feedback equalizer (DFE) but with multiple delays.

The decision feedback equalizer (DFE) 18 in FIG. 2 illustrates one delay stage. However, additional delay stages such as illustrated in the embodiment of FIG. 4. DFE 38 in FIG. 4 employs multiple bit delays for phase adjustment in recovery of the client signal data. The DFE is typically a digital filter and takes the last bit from the current client signal which has been acted upon relative to a bit decision in a CDR decision circuit 42 and is delayed, for example, by T=100 ps at delay stages 39, i.e., delay 50 ps/stage. Then, a weight value, respectively $C_0$ and $C_1$, is multiplied with the bit value from delay stages 39 and then these values are added to a current bit value at summer 41 at the input of decision circuit (DEC) 42. Thus, as indicated earlier, the basic approach of DFE 18 or 41 is to subtract out interference coming from previous decided data bits based upon the decision on the current bit ("0" or "1") and the feedback decision is executed based upon the current signal bit minus interference on a succeeding or downstream signal bit. This DFE function is highly useful toward further mitigation of signal chromatic dispersion at higher bit rates. To be noted here is that it is standard procedure to utilize the recovered data clock, recovered from the CDR, to drive the decision circuit (DEC) 42 as shown at 36. Also, the recovered clock is employed by delay stages, as seen at 37, to provide timing for the amount of delay. Therefore, the previous bit delay relies on the recovered client signal clock.

Figure 5:
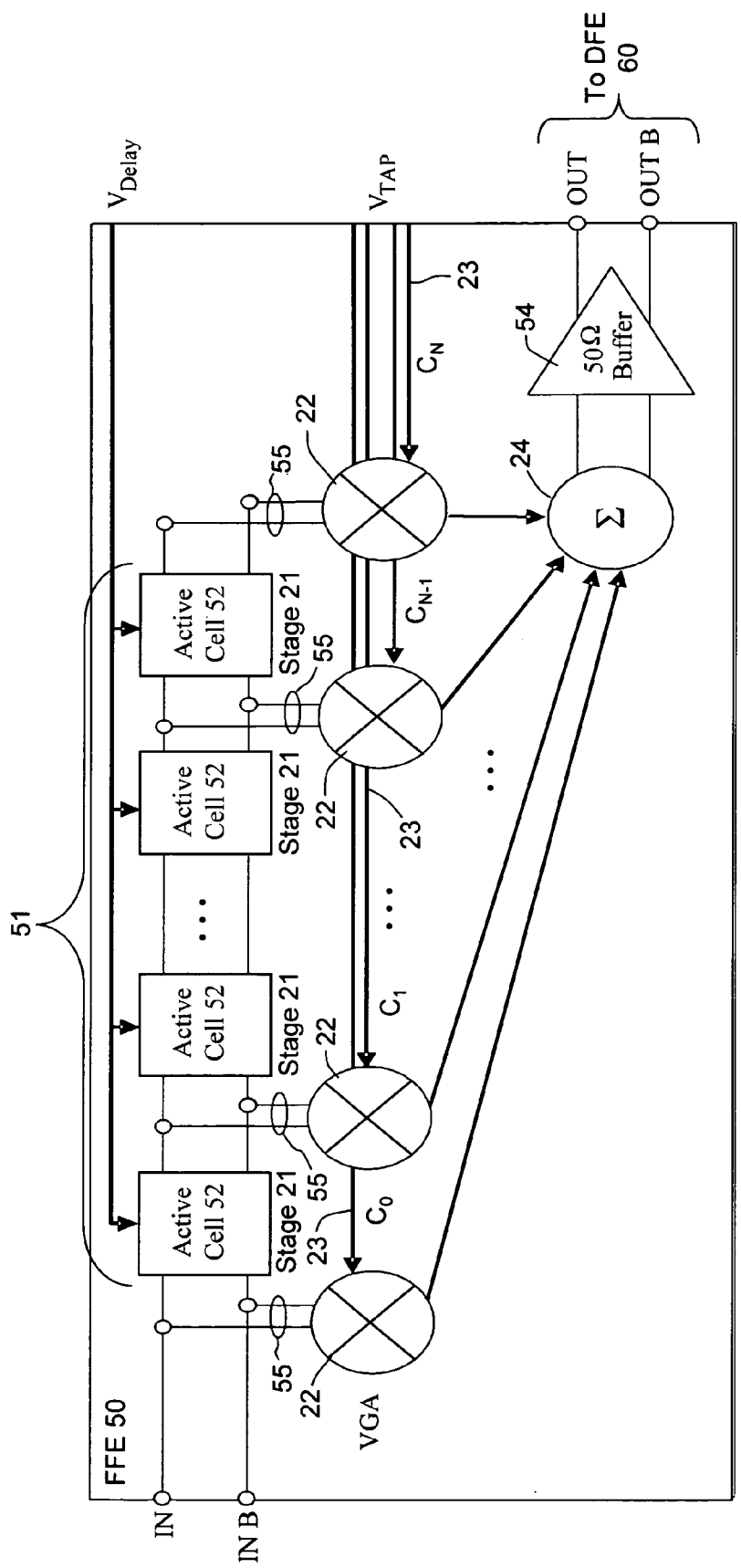
FIG. 5 is a diagrammatic view of a feedforward equalizer (FFE) with an active cell delay line comprising this invention.

Reference is now made to FIG. 5 which discloses a feedforward equalizer (FFE) 50 having an active delay line 51 according to this invention. Like parts with the FFE 14 shown in FIG. 2 have the same numerical identifiers in FIG. 5 except, in the case here, the delay stages in line 51 are comprised of active delay cell circuit 52 which are one or more unit-gain amplifiers as shown in more detail in FIG. 7. The amplifiers chosen for the delay line are those which provide sufficient impedance mismatch between stages without substantially affecting the frequency response of the signal being delayed. Also, shown in FIG. 5, there is an output 50Ω buffer driver circuit 54 for signal driving and impedance matching to the following-circuit. Instead of distributed amplifier approach, for example, as shown in FIG. 3, which is comprised of comparatively large passive delay elements, an active delay cell circuit 52 for each delay stage 21 is utilized which materially reduces the size of the required delay circuit.

Figure 6:
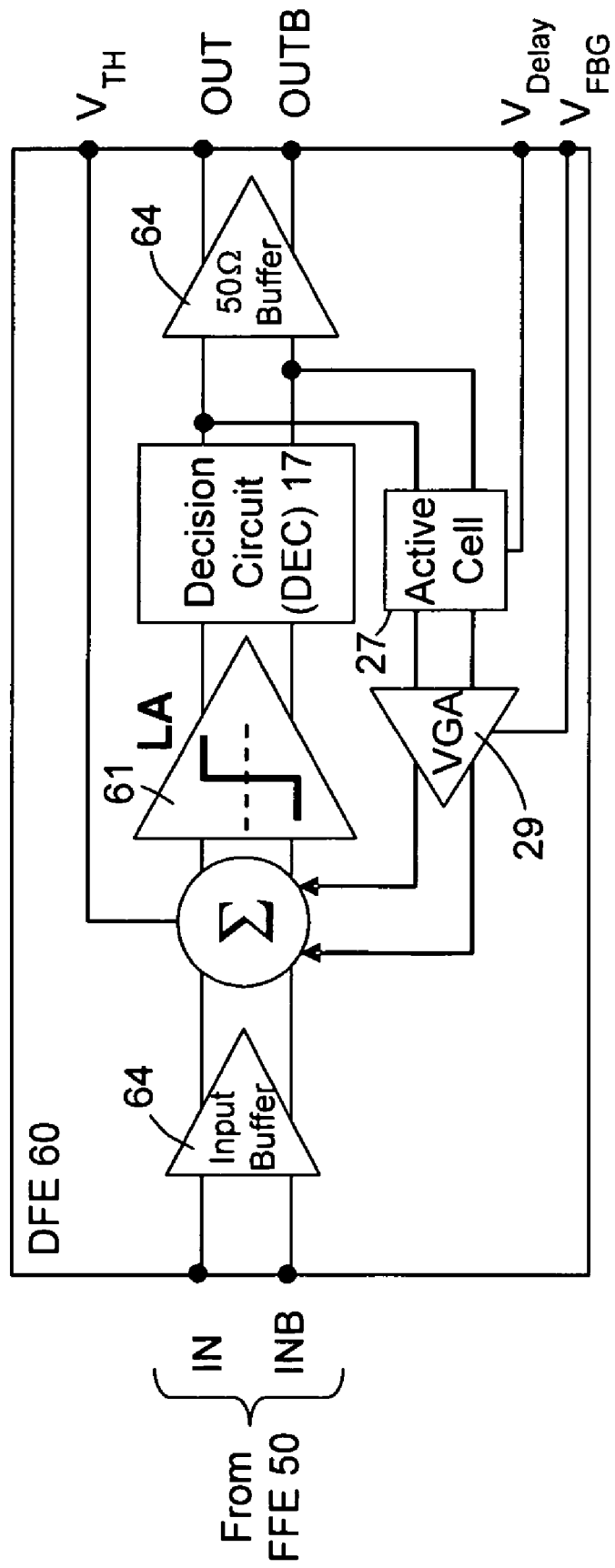
FIG. 6 is a diagrammatic view of a decision feedback equalizer (DFE) with an active cell delay comprising this invention.

The same active delay cell circuit 52 may be also employed in DFE 18 which is illustrated in DFE 60 in FIG. 6 as a single active delay stage 27. The use of such an active delay cell means that the retiming using a recovered client clock is not necessary for the operation of DFE 60. Therefore, a customary, full CDR circuit is not necessary to achieve a one bit delay in decision circuit (DEC) 17 of DFE 60. Furthermore, without the requirement for the recovered client clock, the electronic recovery in digital form of the client signal from the transported optical signal is accomplished as close as possible to the point of analog optical-to-electrical signal conversion which, in the case of the embodiment in FIG. 1, means close to the photodetector 14. In present day network equipment installations, the high frequency converted analog signal may travel over one or more metal traces and/or through integrated circuitry before converted to digital form so that the signal may become even more distorted before reaching the digital client signal decision circuit (digital conversion) is finally accomplished. In the invention here, digital conversion is accomplished very close to the point of origin of the analog optical-to-electrical signal conversion so that significant signal distortion is not introduced into the signal prior to digital conversion.

Figure 7:
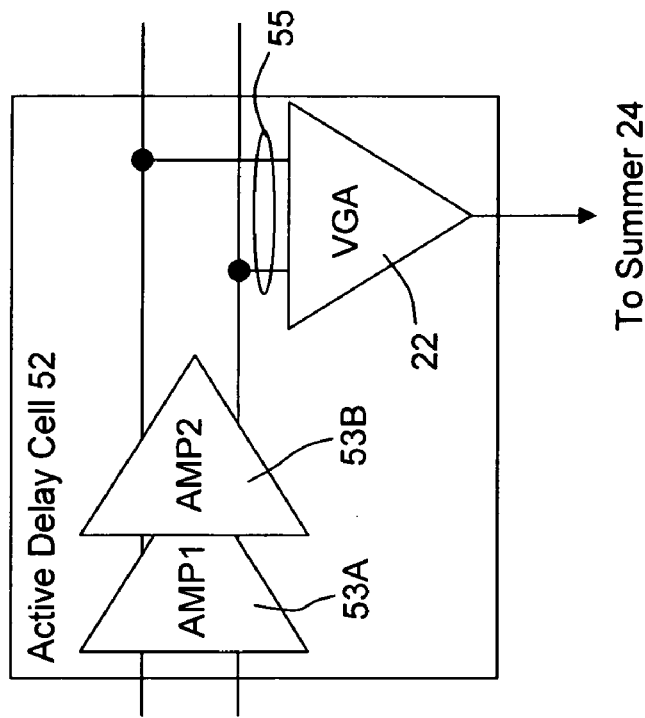
FIG. 7 is an example of detailed circuit diagram of an active delay cell that may be employed in the equalizer circuits in FIGS. 5 and 6.

From the foregoing, it should be realized that most critical element in FFE 50 in FIG. 5 is the active delay line 51, which may be implemented with a wideband unit-gain amplifier or buffer 52 and, therefore, occupies much less area compared to passive LC delay approach as seen, for example, in FIG. 3. To achieve a desired total delay, which is at least two symbol periods, for example, 200 ps for a 10 Gb/s signal, it is necessary to create a cascade of many delay blocks or stages 21. This presents a great challenge in the design of unit-gain buffer active cell 52 because signal bandwidth will be reduced as each stage 21 is added to the cascaded line of stages. Bandwidth and signal delay are related and compromising in that if a wider bandwidth delay line is desired, then, a shorter line delay has to be utilized. A negative feedback amplifier with bandwidth of greater than 11 GHz and nominal delay of 25 ps per amplifier was designed as an active cell stage 52. In a 10 Gb/s network, the bit rate is roughly 100 ps. With a two-stage amplifier for each stage 21, the resultant 50 ps delay can be approximated by one-half of this rate. Therefore, for a 10 Gb/s signal, there is a 50 ps delay per active cell stage 21, each stage comprising two buffer amplifiers per stage and nominally five cell stages are needed with five output taps 55. The active delay cell 52 is shown in more detail in FIG. 7 which comprises a two-stage amplifier 53A and 53B. These amplifiers are unit-gain amplifiers and the type of amplifier for the delay line must be the type that provides sufficient impedance mismatch between the delay stages 21 without substantial deterioration of the frequency response of the client signal undergoing delay. The stage in integrated circuit form can also include VGA circuit 22 with to each cell stage 21, as illustrated in FIG. 7. The overall bandwidth of eight cascaded delay stages, each active cell 52 comprising T=50 ps delay, and this is about 8.5 GHz, which is sufficient for 10 Gb/s signals.

Unlike the passive delay line approach illustrated in FIG. 3 where the signal delay remains relatively constant under process and temperature variation, the delay of an active delay cell 52 will vary, especially with temperature. A control voltage, $V_{Delay}$, as seen in FIGS. 5 and 6, is provided to adjust the delay in order to account for such temperature variations. The control circuit for the control voltage can be automated to make corrected voltage changes to cells 52 based upon, for example, temperature changes in the circuit environment.

Figure 8:
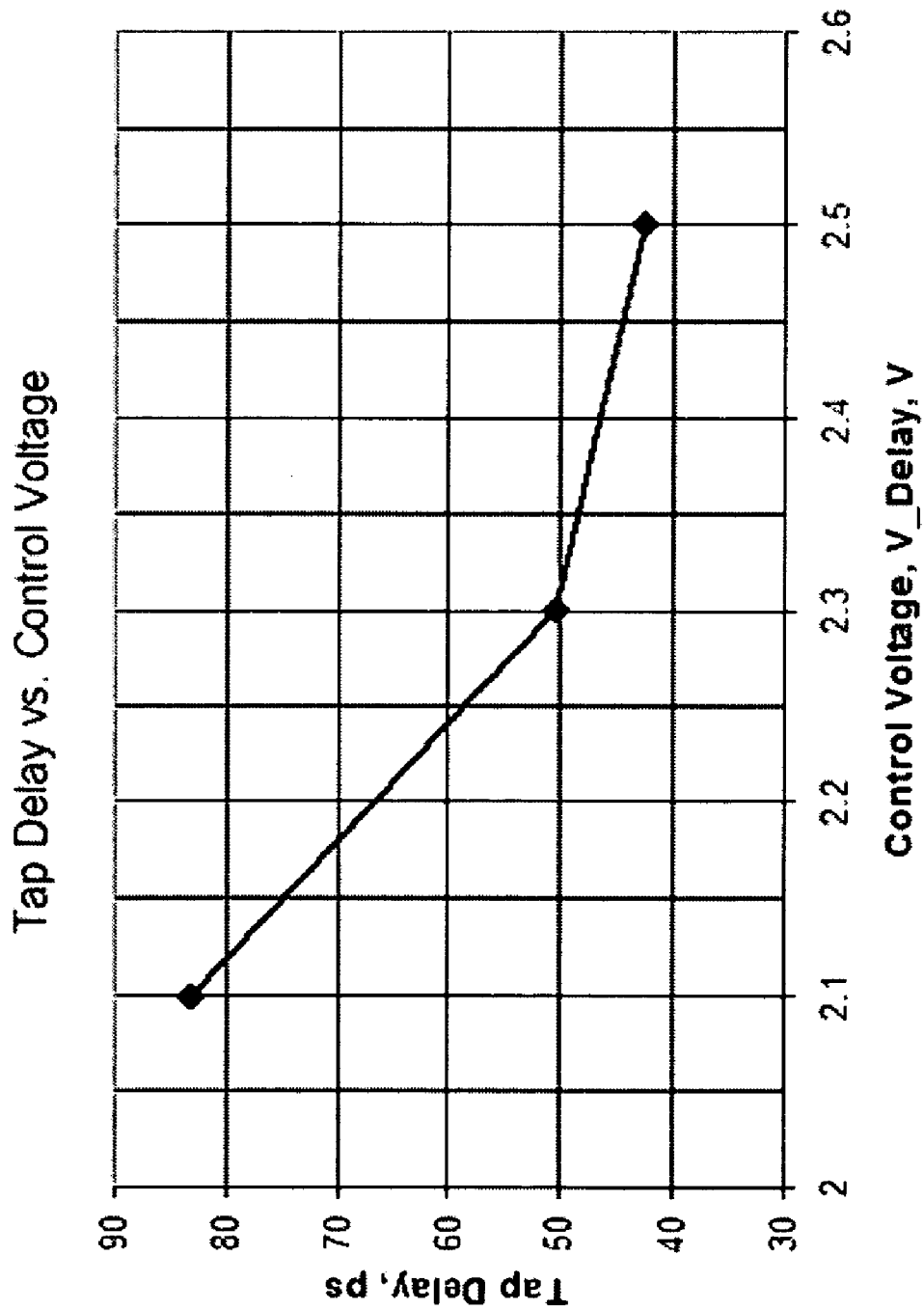
FIG. 8 is a graphic illustration of a tap active delay cell, in picoseconds, versus control voltage, in volts, of the cell comprising this invention.

With respect to the foregoing, it is important to note that an FFE like that shown in FIG. 3 with passive LC delay circuits 34, 35, the delay period, T, does not significantly change with temperature whereas in the case of the active cell buffers 52, due to change with temperature, and reduce in bandwidth with increasing temperature so that the control voltage, $V_{Delay}$, seen in FIG. 5, can be adjusted to return the active cell buffer operation as best as possible to wider bandwidth operation without sacrificing sufficient or adequate signal delay. This variation in control voltage, $V_{Delay}$, in volts verses tap delay in picoseconds is illustrated in FIG. 8 where the 50 picosecond delay is initiated around 2.3 volts for the particular active cell design of FIG. 7. A change in stage bias will change the amount of delay but this will also change the signal bandwidth. Thus, the bias adjustment is employed to adjust the delay to 50 ps, for example, and not necessarily to vary the delay itself in order to set new or different stage delay amounts.

Variable gain amplifiers (VGA) 22 may be a standard Gilbert cell for controlling the tap coefficient, $C_0, C_1 \ldots C_N$, on lines 23 with the sign of the coefficient. One control signal on a line 23 is needed for each VGA as shown in FIG. 5. The output of each VGA 22 is summed together at summer 24 and buffered with a 50Ω driver 54. In FFE circuit 50, the total delay is the combination of the delay of the active delay cells 52 from all stages 21 to provide, for example, a 50 ps delay per stage (FIG. 7 AMP1 at 53A=25 ps delay and AMP2 at 53B=25 ps delay). With the FFE based on active delay cells 52, integration of all required receiver front-end circuitry, including the TIA/AGC 13, as shown in FIG. 1, is realized to form a multiple channel array within a single area of an ASIC chip.

In FIG. 6, DFE 60 includes a one bit active delay 27 comprising an active delay cell 52. The challenge is to achieve a one-bit delay in the feedback path of DFE 60 while maintaining wide bandwidth operation. In the embodiment here, as previously indicated, there is no timing information required for DFE 18, i.e., no recovered signal clock is provided to active cell 52 as there is to the delay stages 39 in DFE 38 FIG. 4, so that the one-bit delay is primarily achieved from active buffer delay stages 21 each comprising amplifiers 53A and 53B, each with about a 25 ps delay. The outputs of limiting amplifier (LA) 61 are sensed and fed into active delay buffer 52 with the amount or amplitude of feedback controlled by VGA 29. The compactness of multiple active delay cells 52 in both FFE 50 and DFE 60 enables the integration of the optical receiver front-end into a completely integrated array form in a die area approximately less than 1% of that required for a passive delay line.

It is worth repeating again that the DFE circuit shown in FIG. 6 has no dependency on the recovered client clock from the incoming client signal. Also, it should be noted in the embodiment of FIG. 6 that the one bit-delay feedback is accurately accomplished through the feedback circuit where the one bit delay and is based upon the time passage of the previous bit through limiting amplifier (LA) 61, decision circuit 17, delay cell 25 and VGA 29, to wit, s total of 100 ps for a baud rate of 10 Gb/s. Also, TIA/AGC and/or VGA 29 and delay cells 52 may be formed in a single integrated circuit.

In summary, the large advantage in the utilization of this invention is the deployment of a single or multiple circuit buffer as an active cell delay stage which are cascaded together, taking up much less IC chip real estate compared to conventional passive delay lines. Comparatively, passive delay line space is in the multi-millimeter range whereas the delay lines of this invention are in the multiple micron range. An example of the passive delay line stage size is about 1.5 mm by 4.5 mm per signal channel compared to a five-tap FFE comprising an eight-amplifier stage device is 300 μm by 200 μm. Thus, this invention provides a distinguished advantage over prior known on-chip delay lines.

Figure 9:
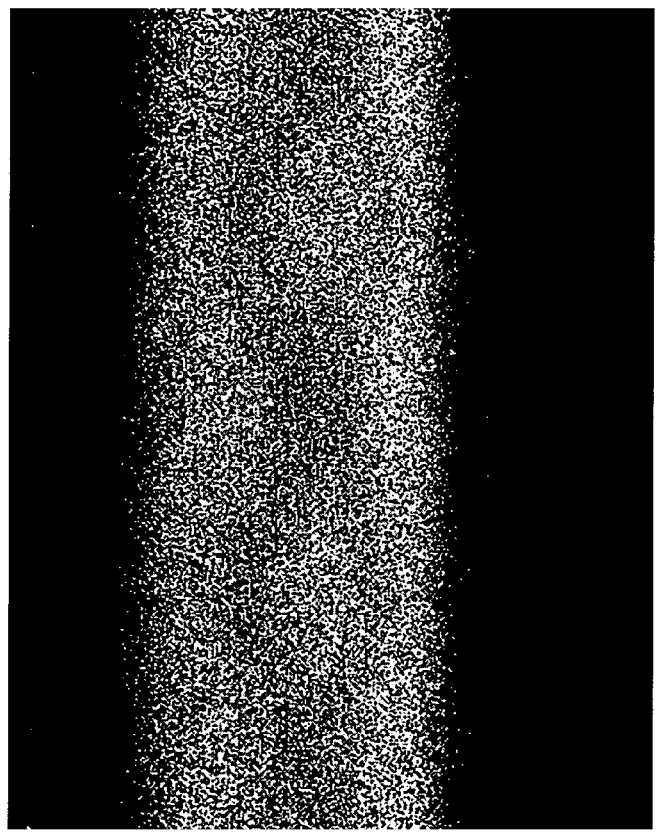
FIG. 9 is a pictorial eye diagram of an input signal to FFE 50 in FIG. 5.
Figure 10:
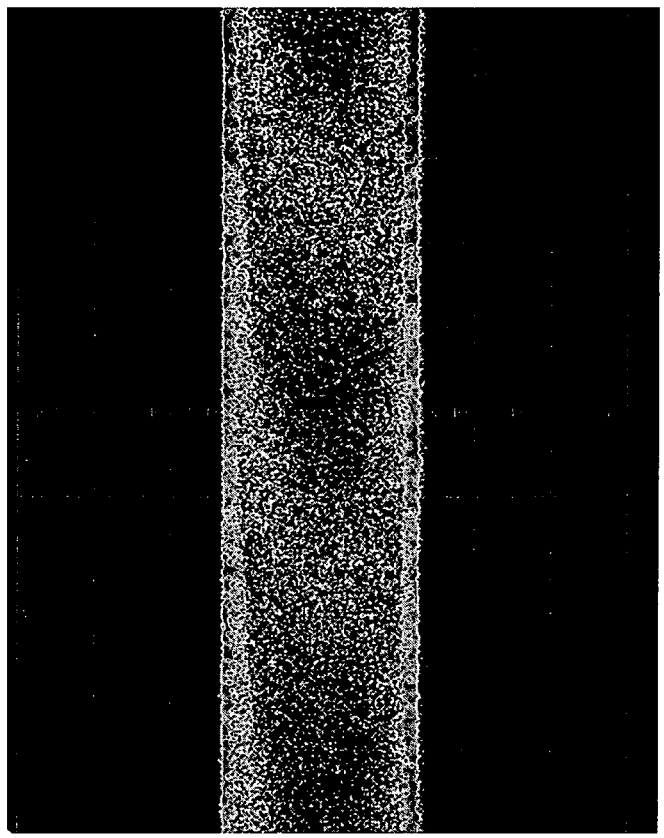
FIG. 10 is a pictorial eye diagram of the electrical output of FFE 50 with all active cells 52 not in operation.
Figure 11:
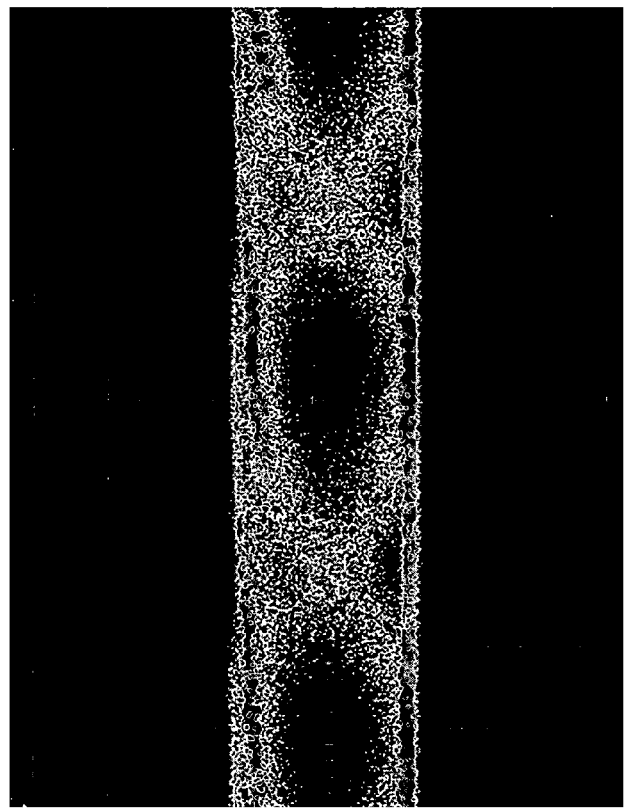
FIG. 11 is a pictorial eye diagram of the electrical output of FFE 50 with all active cells 52 in operation.

The FFE circuit 50 in FIG. 5 has been tested with four stages 21 as shown in FIG. 7 with double active delays 53A and 53B providing for five output taps 55 with pairs of a common and active output lines. FIG. 9 shows the eye diagram of the input signal to FFE 50 such as received from the TIA/AGC circuit 13 in FIG. 1. It can readily be seen that the eye is practically nonexistent and barely discernable due to transmission impairments to the signal. FIG. 10 shows the electrical signal at the output of FFE circuit 50 with only one of the taps 55 of stages 21 is operational, such as for example, the third tap (but this can be any one of the five taps 55) where the signal is taken from the common line of the tap in order to produce an output signal at the output of FFE 50 at buffer 54. In this case, it can be seen that the eye is a little more discernable than in the case of input signal shown in FIG. 9 but it shows that the input signal is highly distorted. To restore the signal, all the other taps 55 are made operational. FIG. 11 shows the electrical signal at the output of FFE circuit 50 where all four stages 21 of five-stage active cell delay line 51 are operational. In this case, it can readily be seen that the five-stage line 51 offers a reconstituted signal having a good eye opening employing an active delay line comprising amplifier stages. In FIG. 11 it is noted that the amplitude of the signal is a little less than the amplitude of the signal in FIG. 10 which is due to the fact that the adjacent taps 55 are normally negative compared to the common line of each tap 55 so that the additive effect is a reduced amplitude in the eye diagram.

While the invention has been described in conjunction with several specific embodiments, it is evident to those skilled in the art that many further alternatives, modifications, and variations will be apparent in light of the foregoing description. For example, the active cell delay line can be employed in any electronic application where the electrical signals, especially high frequency signals, traversing metal traces on a circuit board and/or through one or more integrated circuit are sufficiently distorted to require rejuvenation by means of an equalizer of this invention that includes an active cell delay and summation. Examples are the backplane of telecommunication equipment and optical transport equipment for long-haul, metro or local area networks. Thus, the invention described herein is intended to embrace all such alternatives, modifications, applications and variations as may fall within the spirit and scope of the appended claims.

What is claimed is:

1. An apparatus configured to receive a first input signal, wherein the first input signal carries a plurality of bits, such that the bits are transmitted to a delay line, one of the plurality of bits being transmitted during a bit period, the apparatus comprising:
    a feedfoward equalizer (FFE) including:
        the delay line, the delay line including plurality of cascaded delay stages configured such that the first input signal propagates through the plurality of cascaded delay stages, each of the plurality of cascaded delay stages including a corresponding one of a first plurality of amplifiers and a corresponding one of a second plurality of amplifiers, each of the first plurality of amplifiers and each of the second plurality of amplifiers having a unity gain, each of the plurality of stages being configured to delay the first input signal by a corresponding one of a plurality of time delays, a third plurality of amplifiers, each of which being coupled to receive a corresponding one of a plurality of first output signals, each of the plurality of first output signals being supplied from a corresponding one of the second plurality of amplifiers, each of the third plurality of amplifiers including a variable gain amplifier and supplying a corresponding one of a plurality of second output signals,
        a first summer circuit configured to receive each of the plurality of second output signals and supply an output sum,
        a buffer circuit configured to receive the output sum and provide a buffered output;
    a controller circuit supplying each of a first plurality of control signals to a corresponding one of the third plurality of amplifiers, the first plurality of control signals being generated by the controller circuit in response to a second input signal indicative of a number of errors present in the first input signal, each of the third plurality of amplifiers supplying a corresponding one of the plurality of second output signals based on, at least in part, a corresponding one of the first plurality of control signals and a respective one of the plurality of first output signals,
    wherein each of the plurality of cascaded delay stages is configured to receive a corresponding one of a second plurality of control signals, the plurality of time delays being adjusted in response to the second plurality of control signals; and
    a decision feedback equalizer circuit configured to receive the buffered output, wherein the decision feedback equalizer circuit includes:
        an input buffer that receives the buffered output and supplies a first output;
        a second summer circuit that receives the first output, and supplies a second output;
        a limiting amplifier that receives the second output and supplies a third output;
        a decision circuit that supplies a fourth output;
        an active cell that receives the fourth output;
        an amplifier that receives the fourth output and supplies an amplified version of the fourth output to the second summer circuit, such that a time period beginning when the fourth output is supplied from the decision circuit until the amplified version of the fourth output is supplied to the second summer circuit is substantially equal to the bit period.

2. The apparatus of claim 1 wherein one of the plurality of time delays being substantially equal to the bit period.

3. The apparatus of claim 2 wherein each of the plurality of delays is substantially equal to 50 ps and the signal has a bit rate of 10 Gb/s.

4. The apparatus of claim 1, wherein a first one of the plurality of cascaded delay stages has a first impedance and a second one of the plurality of cascaded delay stages has a second impedance, the first and second impedances being mismatched.

5. A circuit configured to receive a first input signal, the circuit comprising:
    a feed forward equalizer (FFE), including:
        a plurality of cascaded delay stages configured such that the first input signal propagates through the plurality of cascaded delay stages, each of the plurality of cascaded delay stages including a corresponding one of a first plurality of amplifiers and a corresponding one of a second plurality of amplifiers, each of the first plurality of amplifiers and each of the second plurality of amplifiers having a unity gain, each of the plurality of stages being configured to delay the first input signal by a corresponding one of a plurality of time delays, and a third plurality of amplifiers, each of which being coupled to receive a corresponding one of a plurality of first output signals, each of the plurality of first output signals being supplied from a corresponding one of the second plurality of amplifiers, each of the third plurality of amplifiers including a variable gain amplifier and being configured to supply a corresponding one of a plurality of second output signals, a first summer circuit configured to receive each of the plurality of second output signals and supply an output sum, and a buffer circuit configured to receive the output sum and provide a buffered output;

a controller circuit supplying each of a first plurality of control signals to a corresponding one of the third plurality of amplifiers;

a decision feedback equalizer circuit configured to receive the buffered output; and a forward error correction (FEC) decoder circuit configured to supply a second input signal to the controller circuit, the second input signal being indicative of a number of errors present in the first input signal, the first plurality of control signals being generated by the controller circuit in response to the second input signal, each of the third plurality of amplifiers supplying a corresponding one of a plurality of second output signals based on, at least in part, a corresponding one of a the first plurality of control signals and a respective one of the plurality of first output signals, wherein each of the plurality of cascaded delay stages is configured to receive a control voltage, the plurality of time delays being adjusted in response to the control voltage, and wherein the decision feedback equalizer circuit includes:
an input buffer that receives the buffered output and supplies a first output;
a second summer circuit that receives the first output, and supplies a second output;
a limiting amplifier that receives the second output and supplies a third output;
a decision circuit that supplies a fourth output;
an active cell that receives the fourth output;
an amplifier that receives the fourth output and supplies an amplified version of the fourth output to the second summer circuit, such that a time period beginning when the fourth output is supplied from the decision circuit until the amplified version of the fourth output is supplied to the second summer circuit is substantially equal to the bit period.

6. The circuit of claim 5 wherein one of the plurality of time delays being substantially equal to the bit period.

7. The circuit of claim 6 wherein each of the plurality of delays is substantially equal to 50 ps and the signal has a bit rate of 10 Gb/s.

8. The circuit of claim 5, wherein a first one of the plurality of cascaded delay stages has a first impedance and a second one of the plurality of cascaded delay stages has a second impedance, the first and second impedances being mismatched.

* * * * *